United States Patent [19]

McPherson

[11] Patent Number: 4,700,215

[45] Date of Patent: Oct. 13, 1987

[54] POLYCIDE ELECTRODES FOR INTEGRATED CIRCUITS

[75] Inventor: Joe W. McPherson, Richmond, Tex.

[73] Assignee: Texas Instruments Incorporated, Dallas, Tex.

[21] Appl. No.: 322,797

[22] Filed: Nov. 19, 1981

[51] Int. Cl.[4] .................. H01L 29/04; H01L 23/48; H01L 49/02

[52] U.S. Cl. ........................ 357/71; 357/59; 357/67; 357/6

[58] Field of Search ............ 357/71 S, 59, 67 S, 357/6

[56] References Cited

U.S. PATENT DOCUMENTS

| | | | |
|---|---|---|---|
| 4,135,295 | 1/1979 | Price ................................ | 357/67 S |
| 4,322,453 | 3/1982 | Miller ............................... | 357/67 S |
| 4,329,706 | 5/1982 | Powder et al. .................... | 357/67 S |
| 4,356,622 | 11/1982 | Widmann .......................... | 357/67 S |
| 4,378,628 | 4/1983 | Levinstein et al. ................ | 357/67 S |

Primary Examiner—J. Carroll
Attorney, Agent, or Firm—John G. Graham

[57] ABSTRACT

A semiconductor integrated circuit has electrodes, contacts and interconnects composed of a multilayer structure including a layer of polycrystalline silicon with an overlying layer of a refractory metal silicide such as $MoSi_2$ or $WSi_2$. Adhesion of the metal silicide to the polysilicon is enhanced by forming a thin silicon oxide coating on the polysilicon before sputtering the metal silicide. The resulting structure has low resistance but retains the advantages of polysilicon on silicon.

6 Claims, 9 Drawing Figures

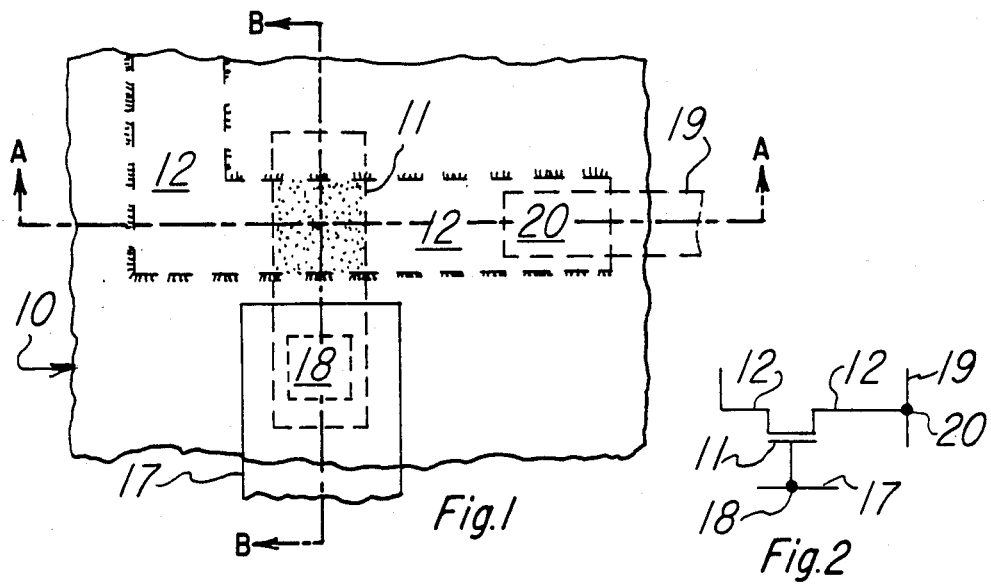
Fig.1
Fig.2
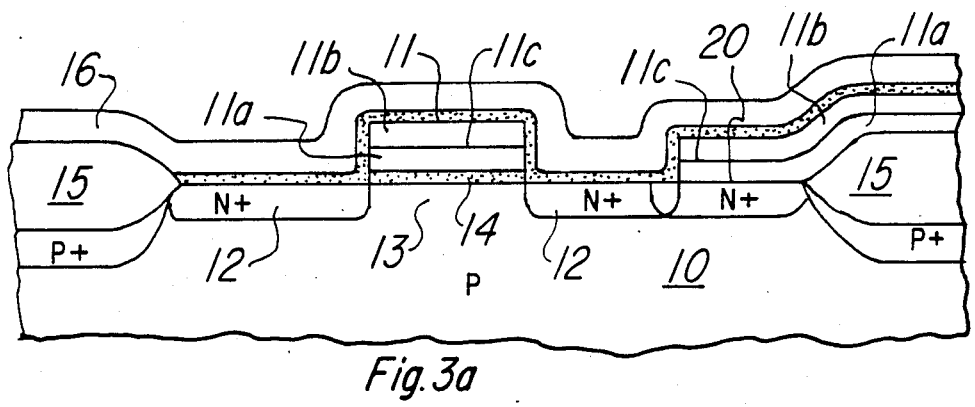
Fig.3a
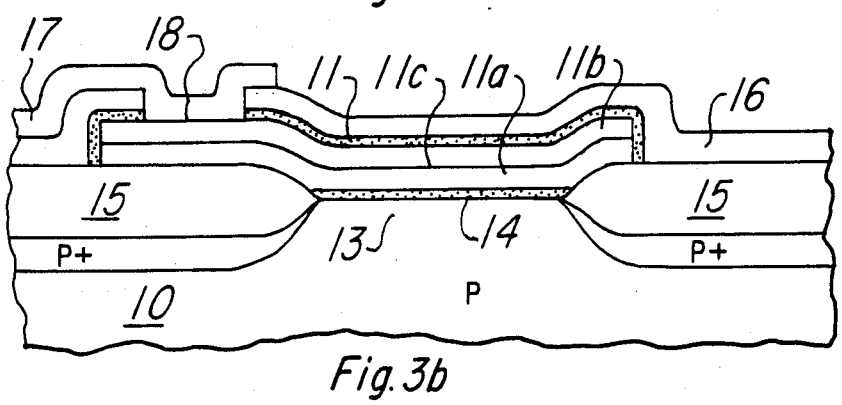
Fig.3b

POLYCIDE ELECTRODES FOR INTEGRATED CIRCUITS

BACKGROUND OF THE INVENTION

This invention relates to semiconductor devices and methods of manufacture, and more particularly to a multilayered contact and interconnection method for semiconductor devices.

In the manufacture of semiconductor memory and microprocessor devices of the MOS/LSI type, a process widely used is shown in U.S. Pat. No. 4,055,444 issued to G. R. Mohan Rao, assigned to Texas Instruments. This process uses polycrystalline silicon as the gate material for N-channel self-alligned silicon-gate transistors. As the size of the transistors is scaled down to achieve higher circuit density, the width of the polycrystalline silicon lines decreases, resulting in problems with resistance of the poly. For this reason, there has been interest in multiple-layer gate and interconnect materials which maintain the properties of polycrystalline silicon but add a high-conductivity layer on top. For example, layers of molybdenum silicide ($MoSi_2$) and tungsten silicide ($WSi_2$) over polysilicon have been proposed, but successful manufacturing methods have not been achieved because of problems with adherence of the top layer to the polysilicon. The silicide alone could function as a gate/interconnect level, without the polycrystalline silicon layer, but this would change the threshold voltage due to a different work function of the gate material, and would cause processing problems such as tube contamination during oxidation, poor step coverage, and rectifying instead of ohmic contact to the silicon substrate.

It is therefore the object of this invention to provide an improved method of making semiconductor devices, and an improved semiconductor device of higher circuit density and/or improved performance. Another object is to provide an improved low-resistance contact and interconnect method and structure for semiconductor devices, particularly N-channel silicon-gate devices. A further object is to provide improved methods of making multilayer contact and interconnect structures for MOS/LSI devices.

SUMMARY OF THE INVENTION

In accordance with one embodiment of the invention, a semiconductor integrated circuit has electrodes, contacts and interconnects composed of a multilayer structure including layer of polycrystalline silicon with an overlying layer of a refractory metal silicide such as $MoSi_2$ or $WSi_2$. Adhesion of the metal silicide to the polysilicon is enhanced by forming a thin silicon oxide coating on the polysilicon before sputtering the metal silicide. The resulting structure has low resistance but retains the advantages of polysilicon on silicon.

BRIEF DESCRIPTION OF THE DRAWINGS

The novel features believed characteristic of the invention are set forth in the appended claims. The invention itself, however, as well as other features and advantages therefore, will be best understood by reference to the detailed description which follows, read in conjunction with the accompanying drawings, wherein:

FIG. 1 is a greatly enlarged plan view of a small portion of a semiconductor chip showing the physical layout of a transistor in an integrated circuit, made according to the invention;

FIG. 2 is an electrical schematic diagram of the transistor of FIG. 1;

FIGS. 3a and b are elevation views in section of the device of FIG. 1, taken along the lines a—a and b—b, respectively.

DETAILED DESCRIPTION OF SPECIFIC EMBODIMENT

Figure 4A:
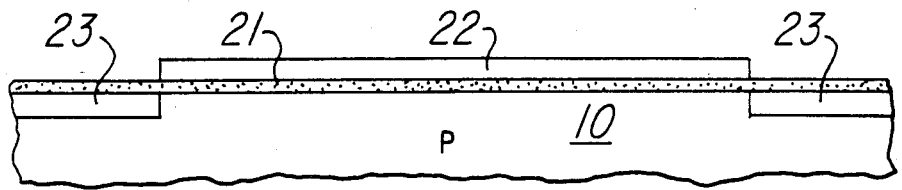
FIGS. 4a-4e are elevation views in section of the cell array of FIGS. 1 and 3a-3b, at successive stages in the manufacturing process, taken generally along the line a—a in FIG. 1.

A semiconductor device made according to the invention is shown in plan view in FIG. 1 and in section in FIGS. 3a and 3b. The device is an insulated-gate field-effect transistor formed at a face of a silicon substrate 10 and has a gate 11, N+ source/drain regions 12, and a channel 13 beneath thin gate oxide 14. Thermally grown field oxide 15 surrounds the transistor, and deposited interlevel oxide 16 separates the gate material from a metal level 17, except at a contact area 18. A first-level interconnect strip 19 composed of the same material as the gate 11 makes contact to the N+source/drain region 12 at a contact area 20.

According to the invention, the gate 11 is a multilayer structure comprised of a polycrystalline silicon layer 11a and a molybdenum silicide layer 11b on top of the polycrystalline silicon. The adherence of the molybdenum silicide layer 11b to the polycrystalline silicon layer 11a is enhanced beyond that which would be expected by a very thin coating of oxide at the interface 11c between the two. This coating is only a few monolayers in thickness, and is indeed disturbed or broken when the layer 11b is applied by sputtering, so no electrical resistance is introduced. It would have been expected that introducing a coating of oxide at the interface 11c would have been detrimental because oxide is an insulator, so care would have been taken to clean the polysilicon surface before deposition of molybdenum silicide. Nevertheless, the oxide at interface 11c produces excellent adhesion and low-resistance ohmic contact.

The device of FIG. 1 is formed on a silicon bar which would typically contain perhaps 64K bits of memory on a bar less than 150 mils on a side or less than 25,000 mil$^2$ area, depending upon the cell density. The transistor shown would be on a minute part of the bar, perhaps less than one mil wide.

Turning now to FIGS. 4a-4e, a process for making an integrated circuit according to the invention will be described. The starting material is a slice of P type monocrystalline silicon, typically four inches in diameter, cut on the <100>plane, of a resistivity of about 10 to 15 ohm-cm. As mentioned above, in the FIGURES the portion shown of the bar 10 represents only a very small part of one bar, and the slice contains hundreds of bars. After appropriate cleaning, the slice is oxidized by exposing to oxygen in a furnace at an elevated temperature of perhaps above 1000° C. to produce an oxide layer 21 over the entire slice of a thickness of about 1000 Å. Next, a layer 22 of silicon nitride of about 1000 Å thickness is formed over the entire slice by exposing to an atmosphere of dichlorosilane and ammonia in a reactor. A coating of photoresist is applied to the entire top surface of the slice, then exposed to ultraviolet light through a mask which defines the desired pattern of thick field oxide 15 and the P+ channel stops. The resist is developed, leaving areas where nitride is then removed by etching the exposed part of the nitride layer 22 but leaving in place the oxide layer 21.

Using photoresist and nitride as a mask, the slice is subjected to a boron implant step to produce the channel stop regions in unmasked regions 23 of silicon. The regions 23 will not exist in the same form in the finished device, because silicon is consumed in the field oxidation procedure. Usually the slice is subjected to a heat treatment after implant, prior to field oxide growth, as set forth in the above mentioned U.S. Pat. No. 4,055,444.

Figure 4B:
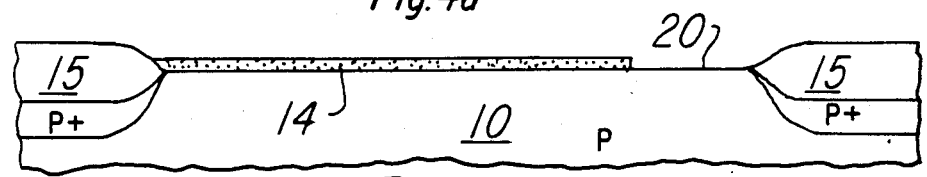

The next step in the process is the formation of field oxide 15 by subjecting the slices to steam or an oxidizing atmosphere at about 1000° C. for >10 hours. This causes a thick field oxide layer 15 to be grown as seen in FIG. 4b, extending into the silicon surface as silicon is consumed, with the remaining part of the nitride layer 22 masking oxidation. The thickness of this layer 15 is about 10,000 Å, part above the original surface and part below. The boron implanted P+ regions 23 are partly consumed, but also diffuse further into the silicon ahead of the oxidation front to produce P+ field stop regions beneath the field oxide.

Next the remaining nitride layer 22 is removed by an etchant which attacks nitride but not silicon oxide, then the oxide 21 is removed by etching and the exposed silicon cleaned. The gate oxide layer 14 is grown by thermal oxidation to a thickness of about 400 Å. The oxide layer 14 is patterned using photoresist to open the contact area 20 for the polysilicon-to-moat contact.

Figure 4C:
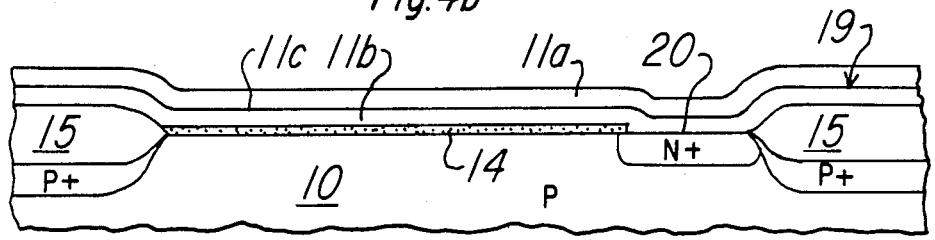

As seen in FIG. 4c a layer 11a of polycrystalline silicon is deposited over the entire slice in a reactor using standard techniques to a thickness of about 2500 Å. In prior processes where only polysilicon is used the thickness would have been about 5000 Å. This polysilicon layer 11a is first doped with phosphorus to make the polysilicon conductive, and to form an N+ region beneath the contact area 20, and then it is subjected to a surface preparation prior to deposition of MoSi$_2$ according to the invention. First the surface is subjected to an HF deglaze which is a standard process step for removing the phosphorus glaze created during the N+ deposition. Then the slice is dipped in nitirc acid HNO$_3$ at 70° C. for about 30 sec., which is sufficient to grow a few monolayers of oxide on the poly layer; this oxide at interface 11c is needed to achieve good adhesion between the MoSi$_2$ layer 11b and the poly 11a. Adhesion is further enhanced by preheating the slice at this point (about 20 min. at 250° C.) before sputter deposition of MoSi$_2$, then continuous heating (at 400° C.) during sputtering. The sputter source is stochiometric MoSi$_2$ (or WSi$_2$ as mentioned below). The resistance of sputtered MoSi$_2$ 11b (thickness is 2500 Å) is too high due to its amorphous structure, and so an anneal step is needed to form a polycrystalline material in layer 11b which then will have a sheet resistance ten times less than polysilicon layer 11a. The anneal step may be a separate operation, for example 1 hour at 1000° C. in N$_2$, or it may be accomplished by the drive-in step after the source/drain implant. In any event, after sputtering, the device is as seen in FIG. 4c.

At the interface 11c no traces of the silicon oxide layer can be found after sputtering of moly silicide. Analysis of the layers will show a very slight graded concentration of silicon oxide in the lower part of the moly silicide layer 11b. The high energy of the initial sputtered MoSi$_2$ particles probably break up the silicon oxide coating at the interface 11c, the coating being only about 40 Å in thickness, and/or penetrates through it, so an area of mixed MoSi$_2$/SiO$_2$ is created.

Figure 4D:
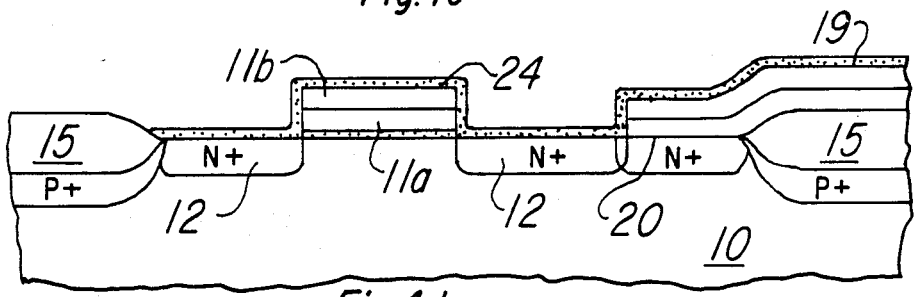

Referring to FIG. 4d, the multilayer structure is next patterned using photoresist, leaving the gate 11, interconnect 19 and various other contacts, interconnects, etc., not shown. The molybdenum disilicide is etched using a plasma etch available for this purpose, for example SF$_6$ and argon, then the polysilicon etched using the same etchant in the plasma reactor. An arsenic implant is now performed to create the N+ source and drain regions 12, using the polysilicon and MoSi$_2$ layer 11a, 11b as a mask. A thermal oxide layer 24 of 1000 Å thickness is grown on the exposed silicon and on the layer 11b by exposing to oxygen in a tube furnace at about 1000° C. for a short time. An important point is that the silicon in the layer 11b is not consumed by this oxidation, but instead the polysilicon layer 11a is the source of silicon which penetrates through the layer 11b to combine with oxygen to create thermal oxide 24. Therefore, free Mo, a contaminant, is not a product of the oxidation. A high temperature step at about 1000° C. is needed here to drive in the arsenic and/or anneal the implant; this may also anneal the MoSi$_2$.

Figure 4E:
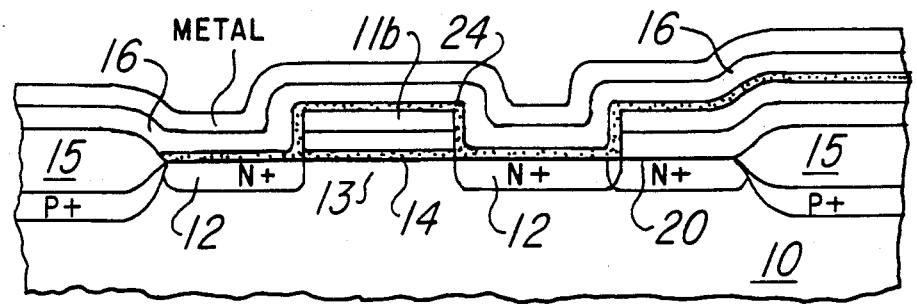

Referring to FIG. 4e, a thick layer 16 of silicon oxide is deposited over the entire slice by decomposition of silane at a low temperature, about 400°C. This layer 16 insulates the metal layer from the gate layer 11 and interconnect 19 and from other areas of the face of the bar, and is referred to as multilevel oxide. The multilevel oxide layer 16 (underlying thin thermal oxide 24) is now patterned by a photoresist operation which exposes holes for what will be the metal-to-poly contacts 18 and the like. Metal contacts and interconnections such as line 17, used in the chip in a memory array, input buffers, decoders, etc., as well as for bonding pads which provide connection to external electrodes, are formed next. The metal line 17 is made in the usual manner by depositing a thin film of aluminum over the entire top surface of the slice then patterning it by a photoresist mask and etch sequence, leaving the metal strips 17 as in FIG. 1, and other metal elements. A protective overcoat (not shown) is then deposited and patterned to expose the bonding pads, and the slice is scribed and broken into individual bars which are packaged in the customary manner.

It is important to note that the thin oxide coating at interface 11c may be formed by other means instead of HNO$_3$ dip. For example, thermal oxidation could be used, but would take longer. Also, tungsten disilicide may be used in place of moly. A single level poly device is shown, but it will be appreciated that multiple level structures such as EPROMs or DLP·RAM cells as in U.S. Patents may be employed because insulating thermal oxide 24 can be formed over the moly silicide 11b.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed is:

1. A semiconductor device comprising at least one region in a face of a semiconductor body and a polycrystalline silicon electrode on said face associated with the region, a layer overlying said electrode composed of a silicide of a refractory metal, and a thin region of silicon oxide particles at the interface between the layer and the electrode, the layer making low-resistance ohmic electrical contact to the electrode.

2. A device according to claim 1 wherein the electrode is composed of molybdenum disilicide.

3. A device according to claim 1 wherein the electrode is composed of tungsten disilicide.

4. A semiconductor device having an electrode on a face of a semiconductor body, the electrode composed of a layer of molybdenum or tungsten silicide adhered to an underlying layer of polycrystalline silicon by a thin interface region of discontinuous silicon oxide between the silicide and the polycrystalline silicon to enhance adhesion, the silicide making low-resistance ohmic connection to said polycrystalline silicon.

5. A device according to claim 4 wherein said electrode is the gate of an insulated-gate field-effect transistor.

6. A device according to claim 5 wherein said transistor is an N-channel transistor.

* * * * *